United States Patent
Theodore et al.

(10) Patent No.: US 7,736,996 B2
(45) Date of Patent: Jun. 15, 2010

(54) METHOD FOR DAMAGE AVOIDANCE IN TRANSFERRING AN ULTRA-THIN LAYER OF CRYSTALLINE MATERIAL WITH HIGH CRYSTALLINE QUALITY

(75) Inventors: Nirmal David Theodore, Mesa, AZ (US); John L. Freeman, Jr., Mesa, AZ (US); Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 554 days.

(21) Appl. No.: 11/554,847

(22) Filed: Oct. 31, 2006

(65) Prior Publication Data

US 2007/0141740 A1    Jun. 21, 2007

Related U.S. Application Data

(63) Continuation-in-part of application No. 11/106,849, filed on Apr. 15, 2005, now abandoned.

(51) Int. Cl.
H01L 21/46 (2006.01)
(52) U.S. Cl. .............. 438/458; 257/E21.568; 438/455
(58) Field of Classification Search .......... 257/E21.568; 438/455, 458
See application file for complete search history.

(56) References Cited

U.S. PATENT DOCUMENTS

| | | | |
|---|---|---|---|
| 4,846,931 A | 7/1989 | Gmitter et al. | |
| 5,374,564 A | 12/1994 | Bruel | |
| 5,583,059 A * | 12/1996 | Burghartz | 438/319 |
| 5,877,070 A | 3/1999 | Goesele et al. | |
| 6,029,602 A * | 2/2000 | Bhatnagar | 118/723 ME |
| 6,033,974 A * | 3/2000 | Henley et al. | 438/526 |
| 6,352,909 B1 | 3/2002 | Usenko | |
| 6,573,126 B2 | 6/2003 | Cheng et al. | |
| 6,642,091 B1 * | 11/2003 | Tanabe | 438/166 |
| 6,713,326 B2 | 3/2004 | Cheng et al. | |
| 6,806,171 B1 | 10/2004 | Ulyashin et al. | |
| 7,223,994 B2 | 5/2007 | Chidambarrao et al. | |
| 2004/0166650 A1 * | 8/2004 | Yokokawa et al. | 438/455 |
| 2005/0070071 A1 | 3/2005 | Henley et al. | |

OTHER PUBLICATIONS

Binetti, S. et al.; "Passivation of Extended Defects in Silicon by Catalytically Dissociated Molecular Hydrogen"; J. Phys III France; Jul. 1997; pp. 1487-1493; Les Editions de Physique.
Office Action mailed Jun. 11, 2006 in U.S. Appl. No. 11/106849.

(Continued)

*Primary Examiner*—Asok K Sarkar
(74) *Attorney, Agent, or Firm*—Michael J. Balconi-Lamica; James L. Clingan, Jr.

(57) ABSTRACT

A method for damage avoidance in transferring a monocrystalline, thin layer from a first substrate onto a second substrate involves epitaxial growth of a sandwich structure with a strained epitaxial layer buried below a monocrystalline thin layer, and lift-off and transfer of the monocrystalline thin layer with the cleaving controlled to happen within the buried strained layer in conjunction with the introduction of hydrogen.

12 Claims, 3 Drawing Sheets

OTHER PUBLICATIONS

Final Rejection mailed Sep. 17, 2009 in U.S. Appl. No. 11/106849.
Yonehara, T. et al.; "Epitaxial layer transfer by bond and etch back of porous Si1"; Applied Physics Letters; Apr. 18, 1994; vol. 64; American Institute of Physics. Abstract is being submitted. Full Article available for purchase and was submitted in parent, U.S. Appl. No. 11/106,849.

* cited by examiner

METHOD FOR DAMAGE AVOIDANCE IN TRANSFERRING AN ULTRA-THIN LAYER OF CRYSTALLINE MATERIAL WITH HIGH CRYSTALLINE QUALITY

CROSS-REFERENCE TO CO-PENDING APPLICATION

This application is a continuation-in-part of patent application Ser. No. 11/106,849, entitled "Method of Transferring a Thin Crystalline Semiconductor Layer," filed Apr. 15, 2005 now abandoned.

FIELD OF THE INVENTION

The present invention relates generally to silicon-on-insulator (SOI) wafers and more particularly to a method for damage avoidance in transferring an ultrathin layer of monocrystalline semiconductor from one substrate to another.

RELATED ART

Past methods for producing silicon-on-insulator (SOI) wafers have involved epitaxial growth of silicon on an insulating substrate, or implantation of oxygen directly into silicon to form buried silicon dioxide layers (SIMOX™). In recent years, other methods have involved the transfer of a thin layer of semiconductor. One example of such a transfer method can be found in U.S. Pat. No. 4,846,931 to T. J. Gmitter et al. entitled "Method for Lifting-off Epitaxial Films". According to the '931 patent, an epitaxial film is grown on a single crystal substrate. Afterward, a thin release layer positioned in between the epitaxial film and the substrate is selectively etched away. As the release layer is removed, the edges of the epitaxial film curl upward and away from the substrate and the epitaxial layer is peeled away. This approach is presently unsuitable for the preparation of SOI wafers because it is limited for lift-off of a film having a small area (about 1 cm$^2$), while films having an area of 100 to 1000 cm$^2$ are presently required for the fabrication of SOI wafers.

A method for transferring monocrystalline layers over thermally oxidized silicon handle wafers by bonding and single etch back of porous silicon is described by T. Yonehara et al. in "Epitaxial Layer Transfer by Bond and Etch Back of Porous Si", Appl. Phys. Lett. 64, (1994) pp. 2108-2110. According to this paper, a thick substrate is made thinner by etching away the substrate until an etch stop (a porous silicon layer) is reached. The method has the disadvantage of high cost to etch an entire semiconductor wafer.

Another method for transferring a semiconductor layer is described in U.S. Pat. No. 5,374,564 to M. Bruel, entitled "Process for the Production of Thin Semiconductor Material Films". According to the '564 patent, hydrogen ions are implanted into a semiconductor substrate, and then are transformed into a quasi-continuous hydrogen layer. This method has disadvantages of the requirement of a high fluence of hydrogen (above 5×10$^{16}$ cm$^{-2}$), the difficulty in transferring an ultra thin (<0.1 micron) layer, and the low crystalline quality of the transferred layer due to surface damage induced by the hydrogen ion implantation.

Attempts were made to improve the Bruel method. In U.S. Pat. No. 5,877,070 to U. M. Goesele et al. entitled "Method for the Transfer of Thin Layers of Monocrystalline Material to a Desirable Substrate," for example, a hydrogen-trap-inducing element such as boron or phosphorus is implanted into a substrate to create a disordered layer that divides the substrate into a lower portion (most of the substrate) and an upper portion that is transferred to a different substrate. After the creation of the disordered layer, hydrogen is implanted near the disordered layer and the substrate is then subjected to heat treatment. The upper portion of the substrate is then bonded to another substrate and the disordered layer is split, thereby transferring the upper portion (i.e. the thin layer) from the first substrate to the second substrate. While this method allows a somewhat reduced dosage requirement for the hydrogen implantation, it is still affected by the same problems as described above for the Bruel method.

U.S. Pat. No. 6,352,909 to A. Y. Usenko entitled "Process for Lift-Off of a Layer From a Substrate" in concerned with another attempt at improving the Bruel method. The '909 patent describes forming a buried layer of defects by implantation. The buried defect layer is used to trap hydrogen. A disadvantage of this method is that the surface of the layer to be transferred is heavily damaged during the implantation and damage is difficult to fix, even by annealing at a relatively high-temperature.

In U.S. Pat. No. 6,806,171 to A. Ulyashin entitled "Method of Producing a Thin Layer of Crystalline Material," a porous silicon layer is created on a silicon substrate, and a nonporous epitaxial layer is grown on the porous layer. The porosity of the now-buried porous layer is increased by hydrogenation techniques, and then the epitaxial layer is cleaved from the sandwich structure at the porous layer. After cleavage, the transferred layer needs to be smoothened. Similar to all the prior art methods mentioned above, this method does not provide any improvement on the smoothness of the transferred layer.

Two approaches that are described by Cheng et al. in U.S. Pat. No. 6,573,126 and in U.S. Pat. No. 6,713,326, both entitled "Process for Producing Semiconductor Article Using Graded Epitaxial Growth", involve using hydrogen ion implantation for lift-off of a semiconductor layer from a heterostructure that includes both a graded SiGe layer and a strain-relaxed SiGe layer. After thermal annealing, a zigzag network of microcracks results in a rough surface of the transferred layer. These approaches have the same limitations as those described by Bruel et al. in U.S. Pat. No. 5,374,564. In particular, a fluctuation in thickness as high as several tens of percent occurs when forming a layer of submicron thickness, and the formation of a uniform layer becomes a large problem for transferring a layer of material having a thickness of less than about 100 nanometers (1 nm=10$^{-9}$ m). The difficulty of forming a thin film with high crystalline quality becomes more severe with an increase in a wafer diameter.

Accordingly, there remains a need for a better method for damage avoidance in transferring ultrathin layers of crystalline semiconductor material and overcoming the problems in the art as discussed above.

BRIEF DESCRIPTION OF THE DRAWINGS

The present invention is illustrated by way of example and not limited by the accompanying figures, in which like references indicate similar elements, and in which:

FIG. 1a shows the introduction of hydrogen into a first heterostructure having a strained layer of $Si_{(1-x)}Ge_x$ in between a thin epitaxial layer and a much thicker substrate layer; FIG. 1b shows the bonding of the epitaxial layer of the heterostructure to a second substrate; and FIG. 1c shows the transferring of the epitaxial layer to the second substrate.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present disclosure.

DETAILED DESCRIPTION

In the parent application, a method for transferring a thin layer of crystalline semiconductor material is described. According to the method, a first heterostructure is formed by depositing a non-graded layer of a material of the formula $Si_{1-x}Ge_x$, wherein $0<x<1$, on a first substrate and thereafter depositing an epitaxial semiconductor layer on the $Si_{1-x}Ge_x$ layer. Hydrogen atoms are introduced into the first heterostructure and allowed to diffuse into the non-graded layer of $Si_{1-x}Ge_x$ layer of the first heterostructure. Afterward, the epitaxial semiconductor layer is bonded to a second substrate to form a second heterostructure. After this bonding step, the second heterostructure is split at the $Si_{1-x}Ge_x$ layer, thereby transferring the epitaxial layer to the second substrate.

Briefly, the method according to one embodiment is concerned with transferring a thin layer of crystalline semiconductor from a first substrate to a second substrate. According to one aspect of this embodiment, a thin strained layer of $Si_{(1-x)}Ge_x$ (where $0<x<1$) is grown on the surface of a semiconductor substrate, and then a thin, epitaxial layer of monocrystalline semiconductor is grown on the top of the strained layer. The result is a heterostructure having a buried strained layer. Hydrogen (and/or deuterium) atoms are introduced into this heterostructure and allowed to diffuse into the buried strained layer. Afterward, the thin epitaxial monocrystalline semiconductor layer is bonded to another substrate. A direct wafer bonding or anodic bonding approach, or some other approach may be used to form the intimate and strong bond between the epitaxial layer and the second substrate. After bonding the epitaxial layer to the second substrate, the epitaxial layer is separated from the first substrate by splitting at the buried strained layer. The splitting results in transfer of the thin epitaxial monocrystalline semiconductor layer to the second substrate.

The splitting at the buried strained layer may be controlled so that it occurs when hydrogen is introduced into the heterostructure.

Reference will now be made in detail to the various embodiments of the present disclosure. Similar or identical structure is identified using identical callouts. A schematic representation of the method of the present disclosure is shown in FIGS. 1a, 1b, and 1c.

Figure 1A:
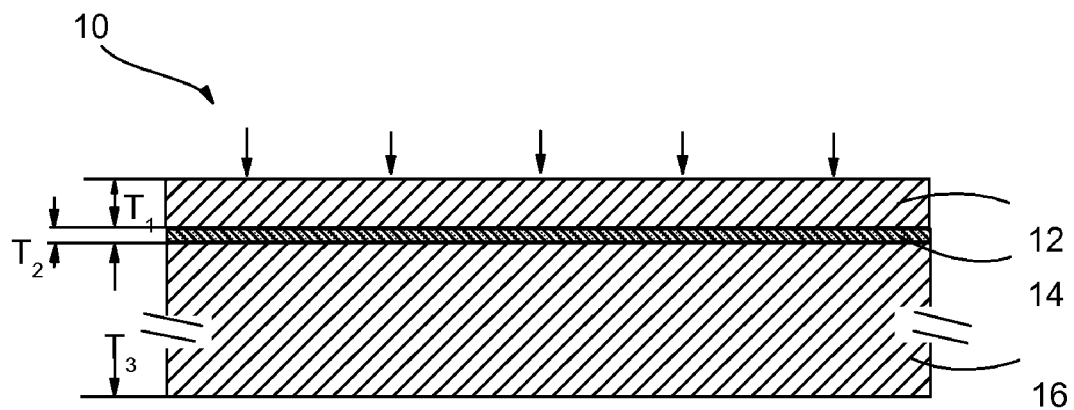
FIGS. 1a-c show schematic representations of aspects of the method of the invention.
Figure 1B:
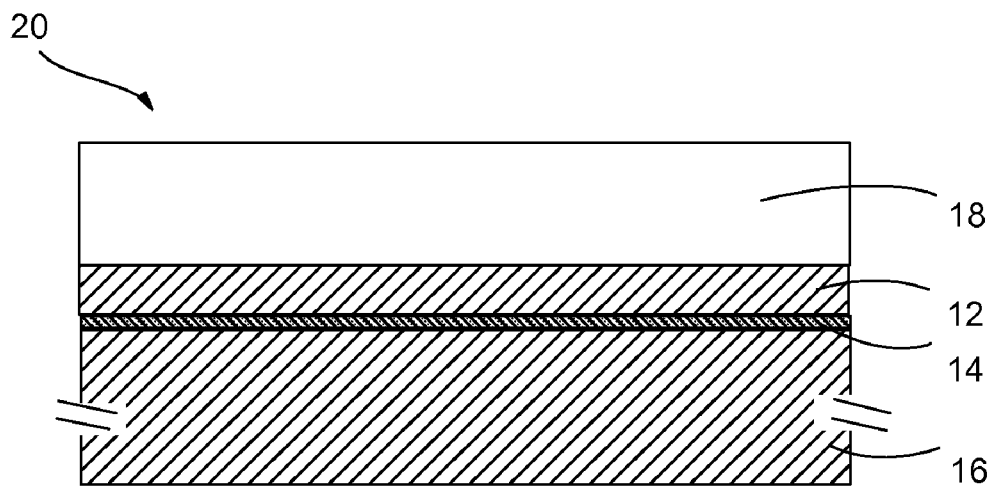
Figure 1C:
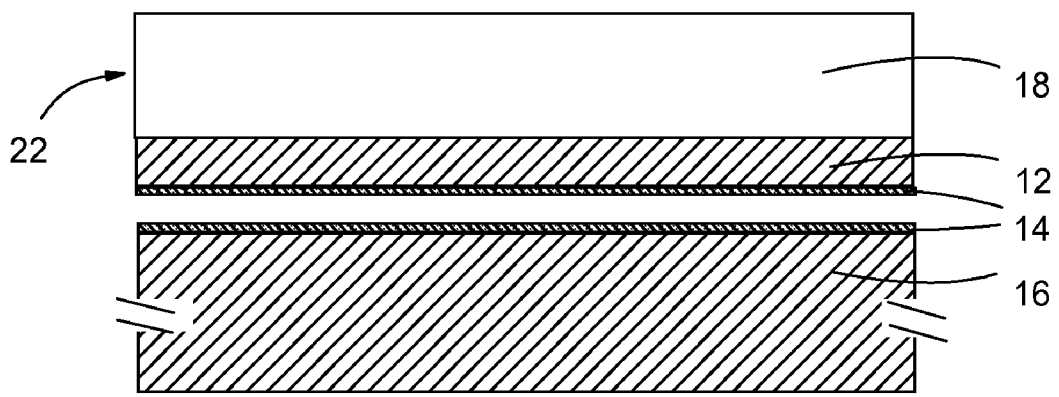

FIG. 1a shows heterostructure 10, which includes thin epitaxial monocrystalline layer 12, buried strain layer 14, and thick substrate layer 16.

In some embodiments, monocrystalline layer 12 includes one or more group IV elements such as carbon, silicon, and germanium. Preferably, layer 12 is a layer of epitaxial monocrystalline semiconductor of the formula $Si_{1-x}C_x$ with C content in the range of from about 1 percent to about 100 percent, or a layer of $Si_{1-x}Ge_x$ with Ge content in a range of about 0 percent to about 100 percent. In some embodiments, layer 12 may include one or more group III and/or group V elements such as boron, indium, phosphorous, antimony, gallium nitride, and the like. Most preferably, layer 12 is a layer of epitaxial monocrystalline silicon.

Layer 14 is a buried strained layer. In an embodiment, the layer 14 is a compressively strained layer. In an alternative embodiment, the layer 14 is a tensilely strained layer. In some embodiments, the strained layer 14 may be a composition of a formula such as $Si_{1-y}C_y$, $Si_{1-x-y}C_xGe_y$, or $Si_{1-y}Ge_y$, where the Ge or C content is in the range of from about 1 to about 100 percent.

Layer 16 is a semiconductor layer. In an embodiment, layer 16 is monocrystalline silicon. In another embodiment, layer 16 has a multilayer structure. Layer 16 may include one or more group III and/or group V elements such as indium, gallium, arsenic, phosphorous, indium gallium arsenide, indium gallium phosphide, gallium nitride or gallium arsenide, and the like. In some embodiments, layer 16 includes one or more group IV elements. The layer 16 may include, for example, Si, $Si_{1-y}C_y$, $Si_{1-x-y}C_xGe_y$, or $Si_{1-y}Ge_y$, with Ge or C content in a range of from about 1 percent to about 100 percent.

The layer 12 has a thickness $T_1$ of from about 10 Angstroms to about 100,000 Angstroms. In certain embodiments, $T_1$ is less than 2000 Angstroms. The layer 14 has a thickness $T_2$ of from about 2 Angstroms to about 10,000 Angstroms. In some embodiments, the layer 14 has a thickness $T_2$ of less than about 1000 Angstroms. In certain embodiments, $T_2$ is less than 100 Angstroms in thickness. Layer 16 has a thickness $T_3$ of from about 1 µm to about 1000 µm (1 µm=$10^{-6}$ meters). In certain embodiments, $T_3$ is less than about 600 µm.

According to one embodiment, layer 12 and layer 14 may or may not have opposite strains. To create buried strained layer 14, the composition of layer 14 is usually different from the composition of layer 12 and layer 16.

The growth of layers 12, 14, and 16 to form heterostructure 10 may be accomplished by any known method for preparing layers of semiconductor materials. These methods include, but are not limited to, thermal chemical vapor deposition, reduced-pressure chemical vapor deposition, molecular beam epitaxy, low temperature molecular beam epitaxy, and sputtering. In some preferred embodiments, layer 12 and layer 14 are grown by one of the methods mentioned above and layer 16 (or part of layer 16) is grown by techniques known in the art as "Czochralski Crystal Growth" or "Float Zone Crystal Growth". Usually, layer 16 has a high degree of chemical purity, a high degree of crystalline perfection, and high structure uniformity.

In an embodiment, the growth of layer 12 and layer 14 is realized by chemical vapor deposition. Usually, a high growth rate of monocrystalline Si layer 12 is more readily achieved by deposition at high chemical vapor deposition temperatures. Furthermore, higher deposition temperatures may reduce the incorporation of impurities and improve layer uniformity. More specifically, tensilely strained layer 12 may be deposited by the use of a silane ($SiH_4$) source gas. Adequate growth rates, i.e., >0.01 Angstrom/s with $SiH_4$ may be attained at a temperature of about 550 degrees Celsius. On the other hand, germane ($GeH_4$) and $SiH_4$ may be used to deposit compressively strained $Si_{1-y}Ge_y$ layer 14. $GeH_4$ decomposes at a temperature of about 400 degrees Celsius. To maintain planarity after deposition, compressively strained $Si_{1-y}Ge_y$ layer 14 may need to be maintained at a relatively low temperature, e.g. less than the 550 degrees Celsius. Higher temperatures may be needed for subsequent rapid Si deposition with $SiH_4$ to form a tensilely strained Si layer (layer 12 for this embodiment).

In another embodiment, the strained structures are grown by molecular beam epitaxy (MBE). The Si and Ge molecular flux are obtained from elemental, ultra-pure Si and Ge sources using electron beam evaporators. The growth rate of Si and Ge can be controlled to be 1 Angstrom/s by holding the substrate temperature at about 650 degrees Celsius. Similar to chemical vapor deposition, the growth temperature for a compressively strained $Si_{1-x}Ge_x$ layer can be selected to be lower than the growth temperature for the tensilely strained Si layer if necessary. To incorporate group III or group V element dopants into the strained layer, usually the growth temperature must be even lower to avoid dopant segregation. For example, antimony (Sb) segregation can be controlled if the growth temperature is about 320 degrees Celsius.

An appropriate surface-cleaning step may be performed if any of layers 12, 14, or 16 has been exposed to the air. The cleaning may involve chemical etching such as dipping into diluted hydrofluoric acid or heating at an elevated temperature under vacuum.

The lattice constant of Si and Ge differ by 4.17%, and therefore it is quite difficult to grow dislocation-free $Si_{1-x}Ge_x$ layers on a Si substrate. However, the lattice mismatch between the two materials can be accommodated by a finite degree of lattice distortion, which means that a dislocation-free strained layer is possible if the $Si_{1-x}Ge_x$ layer is thin enough.

Hydrogenation of heterostructure 10 is achieved by forming ionized hydrogen plasma about heterostructure 10 within an enclosing chamber and by applying repetitive high voltage negative pulses to heterostructure 10 to drive the hydrogen ions into exposed surfaces of heterostructure 10. It should be understood that hydrogenation may involve using normal hydrogen ($H_2$), deuterium ($D_2$), hydrogen deuterium (HD), or mixtures thereof. Hydrogenation is performed with heterostructure 10 at an elevated temperature for a certain duration to introduce enough hydrogen into heterostructure 10 and diffuse the hydrogen into strained layer 14 where at least some of it is trapped. Sub-surface microcracks may be formed during this stage, but the temperature of the heterostructure should be controlled below the temperature at which significant blistering of the surface of the heterostructure occurs. The energy of the hydrogen used for hydrogenation is in the range of about 50 eV to about 50 keV. In some embodiments, the energy of the hydrogen is below 1 keV, and the hydrogenation temperature is below about 600 degrees Celsius, and the hydrogenation duration is less than 10 hours. In an embodiment, the energy of the hydrogen is 500 eV and the substrate temperature is about 300 degrees Celsius and hydrogenation duration is less than 3 hours.

FIG. 1b shows a schematic representation of the heterostructure 20 produced after bonding the monocrystalline epitaxial semiconductor layer 12 to second substrate 18. Second substrate 18 is preferably a material selected from silicon, germanium, oxidized silicon, glass, fused quartz, sapphire, gallium nitride, and silicon carbide. An intimate and strong bond between layer 12 and substrate 18 may be realized using, for example, direct wafer bonding or anodic bonding.

FIG. 1c shows a schematic representation of the transfer of ultrathin monocrystalline epitaxial semiconductor layer 12 onto second substrate 18 to form structure 22. This stage involves the heat treatment of heterostructure 20, which results in separation of ultrathin epitaxial monocrystalline semiconductor layer 12 from strained layer 14. This separation is likely due to crystalline rearrangements and to the coalescence of hydrogen-induced platelets and/or bubbles of hydrogen present in layer 14. The separation is controlled to happen within strained layer 14. The thickness of the transferred layer (i.e. layer 12) may be controlled by choosing the location of strained layer 14 in heterostructure 10.

The heat treatment in the stage of layer transfer is usually at a temperature above about 500 degrees Celsius. It is expected that the threshold temperature for layer transfer may be lower than temperatures usually required by other methods, which would greatly benefit the layer transfer if substrate 18 has a thermal expansion coefficient that is very different from that of the transferred layer (i.e. layer 12).

After the layer transfer, part of layer 14 may still be attached to layer 12. Therefore, an additional step of etching or surface cleaning may be needed to remove the residual materials from the layer 12.

Figure 2:
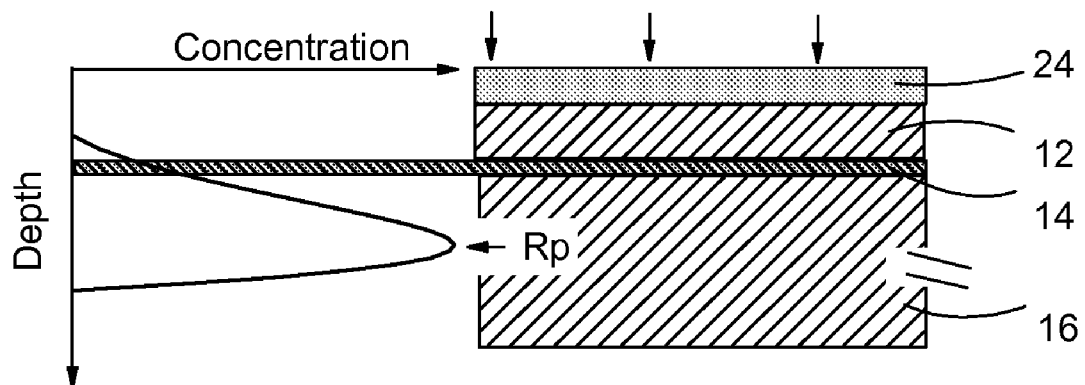
FIG. 2 shows a schematic representation of the introduction of hydrogen into the heterostructure by ion implantation.

It is to be understood that hydrogenation by plasma hydrogen is a presently preferred embodiment. Various methods to introduce hydrogen can be used alternatively. In an embodiment exemplified by FIG. 2, hydrogen ion implantation is used to introduce hydrogen into heterostructure 10. The distribution of the implanted hydrogen in heterostructure 10 usually has a Gaussian-like shape with its concentration peaked at a location denoted in FIG. 2 by Rp (the projected range). The Rp may be controlled by varying the implantation energy. Typically, the implantation energy is in a range from about 1 keV to about 200 keV. The Rp may be controlled to be either shallower or deeper than the location of the strained layer 14. The implanted hydrogen should be able to migrate and to be trapped within strained layer 14. The hydrogen migration and trapping may occur during ion implantation or during thermal annealing after implantation.

In one embodiment of the present disclosure, heterostructure 10 may optionally include encapsulating layer 24 on monocrystalline semiconductor layer 12 to reduce the penetration of ions into heterostructure 10, thereby controlling the depth of the implanted hydrogen. Encapsulating layer 24 also offers a protective function by minimizing contamination of the first heterostructure by possible contaminants. In another embodiment, encapsulating layer 24 is silicon oxide with a thickness of from about 10 nm to about 1000 nm. Encapsulating layer 24 may be removed after the implantation by, for example, gas phase etching or by dipping heterostructure 10 into a dilute solution of acid (HF, for example).

The temperature of the first substrate during ion implantation should be controlled to be low enough to avoid the quick diffusion and escape of implanted hydrogen from the surface. Usually, the implantation temperature should be below about 500 degrees Celsius. Preferably, the temperature is from about 100 degrees Celsius to about 500 degrees Celsius.

Figure 3:
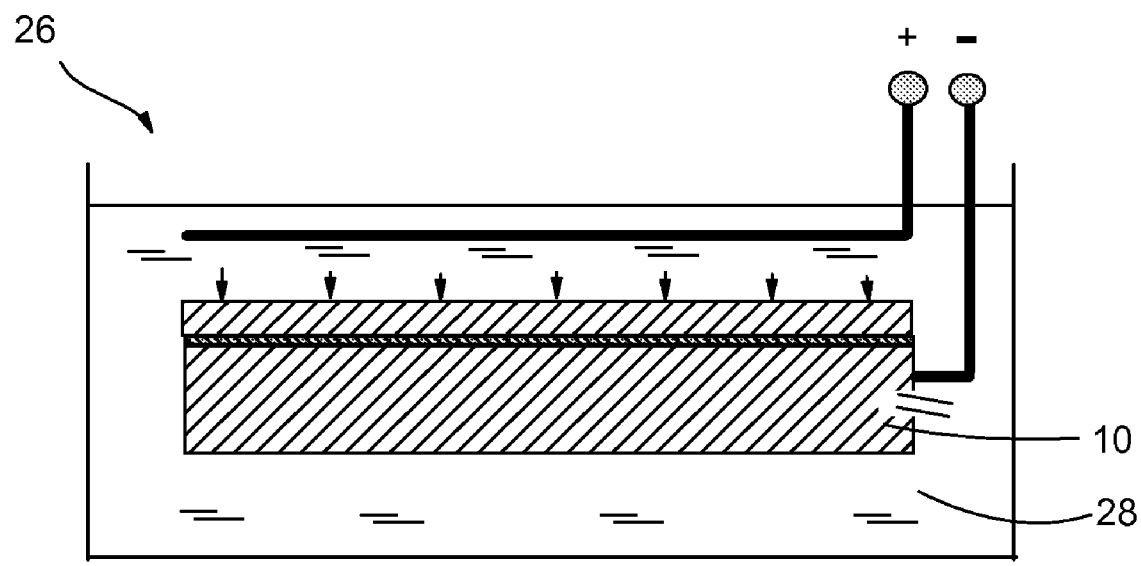
FIG. 3 shows a schematic representation the introduction of hydrogen into the heterostructure by an electrolytic process.

In a still further particular embodiment, the introduction of hydrogen into heterostructure 10 may be realized electrolytically. FIG. 3 is a schematic representation of electrolytic set-up 26 for introducing hydrogen into heterostructure 10. As FIG. 3 shows, heterostructure 10 is in electrolytic contact with electrolyte 28. When electrolyte 28 decomposes during the electrolysis, monatomic hydrogen is produced. A suitable electrolyte should be chosen in order to avoid significant damage on the surface of heterostructure 10 by oxidation or etching. Suitable electrolytes include, but are not limited to, acids such as $H_3PO_4$, HF, HCl, $H_2SO_4$, and $H_3COOH$. After the electrolysis, an appropriate surface cleaning may be performed to remove the hydrogen-rich surface.

The following EXAMPLE is given to illustrate a scope of the present embodiments. Because the example is given for illustration purposes only, the embodiments of the present disclosure should not be limited to the example. An embodiment that will now be described in conjunction with the above drawings relates to the lift-off process to transfer a thin film in a monocrystalline silicon wafer with the aid of plasma hydrogenation. The disclosed process permits an ultra thin top silicon layer in the final silicon-on insulator wafer with its thickness being controllable.

EXAMPLE

On top of a substrate of (100) 500 ohm-cm silicon, an epitaxial $Si_{0.8}Ge_{0.2}$ layer was grown by molecular beam epitaxy growth (MBE). The thickness of the $Si_{0.8}Ge_{0.2}$ layer was about 5 nm. On top of this compressively strained $Si_{0.8}Ge_{0.2}$ layer, a 200 nm thick crystalline Si layer was grown. The resulting heterostructure was hydrogenated using hydrogen plasma, first at a temperature of about 250-300 degrees Celsius for about 1 hour, and then at a temperature of about 300-350 degrees for about two more hours. The bias voltage was 500 volts and the working pressure was 1.3 torr.

For the purpose of comparison, a virgin silicon wafer without an attached strained layer was also hydrogenated under the above conditions.

Figure 4A:
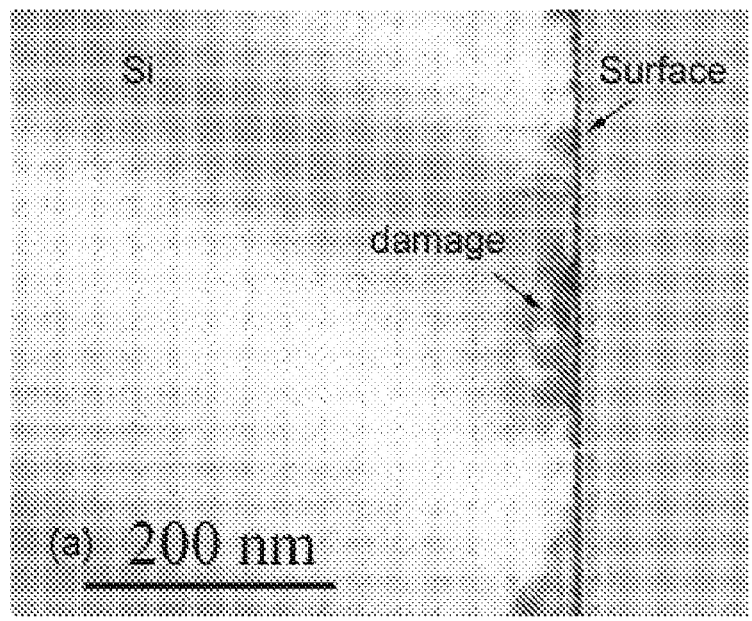
FIGS. 4a-b shows transmission electron microscope (TEM) images of hydrogenated virgin Si (a) and strain engineered Si (b) in accordance with one embodiment of the present disclosure.
Figure 4B:
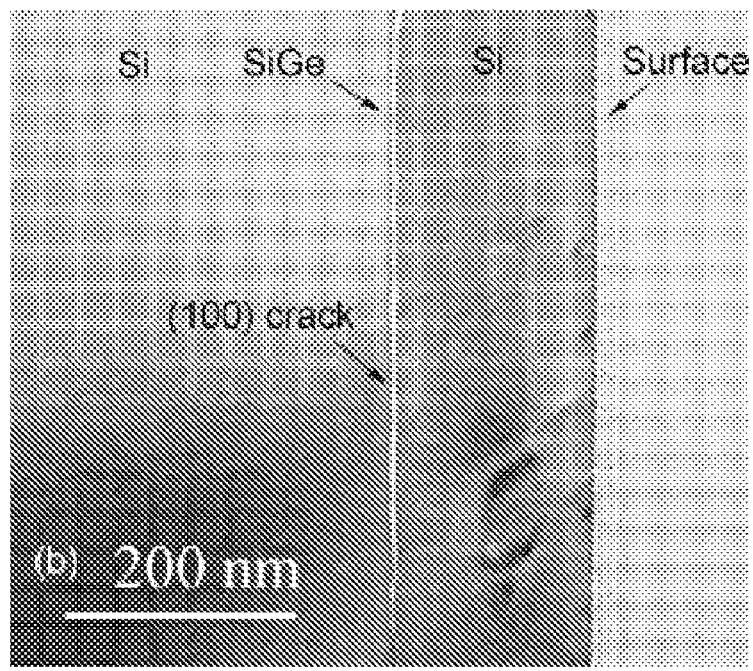

FIG. 4a shows a transmission electron microscopy (TEM) image of a cross-section of the silicon wafer after hydrogenation, and FIG. 4b shows a TEM image of a cross-section of the heterostructure after hydrogenation. As shown in FIG. 4a, the hydrogenated virgin Si is heavily damaged near the surface. No microcracks were observed. By contrast, the heterostructure shown in FIG. 4b has a (100) crack that is parallel to the surface. This crack is necessary for lift-off and transfer of the thin crystalline Si layer to another substrate. The location of the crack exactly corresponds to the location of compressively strained $Si_{0.8}Ge_{0.2}$ layer, which demonstrates that the splitting is controlled by introducing the strained layer.

A methodology that is similar to that described above can also be used for layer splitting, where the strained layer 14 is replaced by a doped layer 14. In such an embodiment, hydrogen getters to the doped layer and enables splitting to occur at this doped layer.

As discussed herein, various processes have been developed for thin semiconductor-layer transfer for heterogeneous material integration. In addition, various problems with current layer transfer methods include fluctuation in thickness, and difficulty in forming thin uniform sub-100 nm thick layers with good crystalline quality. In certain of the embodiments as discussed herein which do not include the damage avoidance aspects, the hydrogenation method results in plasma hydrogenation damage in the surface Si (i.e., which becomes the ultra-thin active Si layer upon layer transfer). For example, some amount of damage can be observed at the surface of and within the ultra-thin Si layer in FIG. 4b.

In particular, the doped layer and strained layer methods for ultra-thin layer transfer (without specifically addressing damage avoidance) use plasma hydrogenation to push H into the stack of epi-Si/strained(doped) layer/Si with H gettering and cleavage at the strained (doped) layer. A disadvantage however is that plasma damage in the epi-Si results in damage in the active-Si transferred layer. Damage to the active-Si transferred layer is significant for fully depleted CMOS. In other words, for fully depleted CMOS devices, the entire SOI layer needs to be substantially defect free.

Damage avoidance measures for incorporation into the methods for transferring an ultra-thin layer of crystalline material with high crystalline quality will now be discussed in the following. The damage avoidance measures incorporated within the methods according to embodiments of the present disclosure aim to avoid plasma damage in the top ultra-thin Si layer to be transferred, improve the uniformity and crystalline quality of such sub-100 nm transferred layers, and to minimize or eliminate hydrogenation plasma damage in the transferred Si.

The method of damage avoidance according to the embodiments of the present disclosure use one or more techniques (or measures), as further discussed herein, to minimize or substantially reduce plasma damage in ultra-thin active silicon to be transferred. In the various embodiments, the damage avoidance measures include one or more of the following:

(a) Use remote plasma hydrogenation, for example, via use of remote glow-discharge plasma. The remote glow-discharge plasma can be implemented using suitable apparatus, for example, commercially available chamber and an integrated remote plasma source from MKS Instruments, of Wilmington, Mass.

(b) Use a sacrificial layer to minimize/eliminate hydrogenation damage in the ultra-thin Si. In this embodiment, the sacrificial layer comprises an oxide, nitride, photoresist or combinations thereof. This embodiment of the method includes hydrogenating the sacrificial layer, stripping the sacrificial layer subsequent to the hydrogenating, and then wafer bonding.

(c) Use a heated catalyst to crack $H_2$, with zero bias or minimal bias to the wafer, and poison or treat the surfaces of the chamber to minimize H recombination on the surfaces.

(d) Use a $H_2$ anneal, instead of a plasma H anneal (to minimize plasma damage).

(e) Use a high keV implant to place the H substantially below the strained-layer or doped-layer. The implant is followed by anneal to diffuse the H to the cleavage-layer.

(f) Use remote glow-discharge plasma in a heated chamber (with a $H_2$ anneal) for repairing damage as it may be created. In another embodiment, a heated wafer chuck, or surface heating of the wafer may be used.

The methods and steps for damage avoidance listed above are performed along with and/or are substituted, as appropriate, into the methods for transferring an ultra-thin layer of crystalline material as described herein.

Briefly, the method according to one embodiment for transferring an ultra-thin layer further comprises trapping H at a strained (or doped) layer; using this trapped H to control cleaving of a superficial semiconductor layer from a substrate wafer; and implementing a cleavage at the thin strained (or doped) layer which results in uniform layer-transfer with a smoother surface (i.e., smoother than obtained by prior art methods). The method further includes bonding the heterostructure wafer 10 to a handle substrate 18 by direct wafer bonding or anodic bonding, etc. The bonded structure 22 is then split at the strained (or doped) layer 14 by thermal shock or knife edge, etc. With respect to a strained layer for GaAs, the strained layer can comprise AlGaAs (or AlAs) for a tensile-stressed strained-layer and InGaAs or InAs for a compressive-stressed strained-layer. With respect to a strained layer for InSb, the strained layer can comprise AlSb or GaSb for a tensile-stressed strained-layer. Furthermore, with respect to the doped-layer for GaAs, beryllium (Be) doping can be used (and likely for InSb as well). In addition, Si doping may also be suitable or applicable.

The method for damage avoidance according to the embodiments of the present disclosure resolves problems in the art by providing techniques to minimize plasma damage in ultra-thin active-silicon to be transferred. As discussed herein, the embodiments include one or more of (a) use of remote plasma hydrogenation, for example, via remote glow-discharge plasma, (b) use of a sacrificial layer, (c) use of a heated catalyst to crack $H_2$, with zero bias or minimal bias to the wafer, (d) use of a $H_2$ anneal, (e) use of a high keV implant to place the H substantially below the strained-layer or doped-layer, (f) use of remote glow-discharge plasma in a heated chamber (with a $H_2$ anneal) for repairing damage as it may be created, and (g) hydrogenate the structure from the back of the wafer rather than from the front of the wafer. In another embodiment, a heated wafer chuck, or surface heating of the wafer may be used. The preceding embodiments are implemented within the method of using a strained-layer (or doped layer) with hydrogenation for transfer of a sub-100 nm Si layer and thereby improves the uniformity and crystalline quality of such sub-100 nm transferred layers.

Accordingly, the method of damage avoidance/reduction according to the embodiments of the present disclosure enables transfer of sub-100 nm layers for fabrication of substantially damage free ultra-thin layer SOI. Furthermore, the embodiments of the present disclosure relate to transferring a thin monocrystalline semiconductor layer from one substrate to another. The embodiments may result in significant improvements that have not been achieved by earlier methods, such as in the quality, surface smoothness, and control of the thickness of the transferred layer.

In the foregoing specification, the disclosure has been described with references to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the embodiments of the present disclosure enable formation of SOI substrates of less than 100 nm active-Si for fully depleted CMOS device applications. The embodiments of the present disclosure may also be implemented in future generation logic, microprocessors, micro-controllers, and the like.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for transferring of a thin semiconductor layer with damage avoidance comprising:

forming a first heterostructure by depositing a non-graded layer of a material of the formula $Si_{1-x}Ge_x$ on a first substrate and thereafter depositing a monocrystalline epitaxial semiconductor layer on the $Si_{1-x}Ge_x$ layer, wherein $0<x<1$;

introducing hydrogen atoms into the first heterostructure and allowing the hydrogen atoms to diffuse into the non-graded layer of $Si_{1-x}Ge_x$ of the first heterostructure, wherein at least one of the introducing and allowing is carried out in conjunction with at least one damage avoidance measure, wherein the at least one damage avoidance measure comprises using a heated catalyst to crack hydrogen ($H_2$), with zero bias or minimal bias to the first heterostructure, and one of poisoning and treating surfaces of a chamber for use in implementing the hydrogenation to minimize H recombination on the surfaces;

bonding the semiconductor layer of the first heterostructure to a second substrate to form a second heterostructure; and splitting the second heterostructure at said $Si_{1-x}Ge_x$ layer, thereby transferring the semiconductor layer from the first heterostructure to the second substrate, wherein the semiconductor layer comprises a substantially defect free semiconductor layer in response to the at least one damage avoidance measure.

2. The method of claim 1, further wherein the substantially defect free semiconductor layer is suitable for use in a fully depleted CMOS device application.

3. The method of claim 1, wherein the at least one damage avoidance measure further comprises using remote plasma hydrogenation.

4. The method of claim 3, further wherein using the remote plasma hydrogenation comprises using remote glow-discharge plasma.

5. The method of claim 1, wherein the at least one damage avoidance measure further comprises using a sacrificial layer overlying the first heterostructure, the sacrificial layer being configured to at least achieve one of minimize and eliminate hydrogenation damage in the semiconductor layer yet to be formed, the method further comprising stripping the sacrificial layer subsequent to the hydrogenating and prior to the bonding of the first heterostructure with a second heterostructure.

6. The method of claim 5, wherein the sacrificial layer comprises oxide.

7. The method of claim 5, wherein the sacrificial layer comprises one selected from the group consisting of oxide, nitride, photoresist, and combinations thereof.

8. The method of claim 1, wherein the at least one damage avoidance measure further comprises using a hydrogen ($H_2$) anneal, in place of a plasma H anneal, to minimize plasma damage to the semiconductor layer of the first heterostructure.

9. The method of claim 1, wherein the at least one damage avoidance measure further comprises using a high keV implant to place the H substantially below the non-graded layer, and following the implant with an anneal to diffuse the H to the non-graded layer, wherein the non-graded layer comprises at least one of a strained-layer and a doped-layer, the non-graded layer further corresponding to a cleavage-layer.

10. The method of claim 1, wherein the at least one damage avoidance measure further comprises using a remote glow-discharge plasma in a heated chamber for repairing damage as it may be created.

11. The method of claim 10, wherein using the remote glow-discharge plasma further includes using the remote glow-discharge plasma in the heated chamber with a $H_2$ anneal for repairing damage as it may be created.

12. The method of claim 11, wherein using the remote glow-discharge plasma still further includes using one selected from the group consisting of a heated wafer chuck and surface heating of the first heterostructure.

* * * * *